(12) United States Patent
Loeppert et al.

(10) Patent No.: US 9,641,950 B2
(45) Date of Patent: May 2, 2017

(54) INTEGRATED CMOS/MEMS MICROPHONE DIE COMPONENTS

(71) Applicant: Knowles Electronics LLC, Itasca, IL (US)

(72) Inventors: Peter V. Loeppert, Durand, IL (US); Sung Lee, Chicago, IL (US)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 14/707,487

(22) Filed: May 8, 2015

(65) Prior Publication Data

US 2016/0060101 A1 Mar. 3, 2016

Related U.S. Application Data

(63) Continuation of application No. PCT/US2014/053235, filed on Aug. 28, 2014.

(Continued)

(51) Int. Cl.
- *B81B 7/00* (2006.01)
- *H04R 19/00* (2006.01)
- *H04R 19/04* (2006.01)
- *H04R 31/00* (2006.01)
- *H04R 7/10* (2006.01)
- *B81B 3/00* (2006.01)

(52) U.S. Cl.
CPC ........... *H04R 31/003* (2013.01); *B81B 3/007* (2013.01); *B81B 3/0051* (2013.01); *H04R 7/10* (2013.01); *H04R 19/005* (2013.01); *H04R 19/04* (2013.01); *B81B 2201/0257* (2013.01); *B81B 2203/0127* (2013.01); *B81C 2203/0145* (2013.01); *B81C 2203/0714* (2013.01); *H04R 2201/003* (2013.01); *H04R 2307/027* (2013.01)

(58) Field of Classification Search
CPC ....... B81B 7/007; B81B 3/0051; B81B 3/007; H04R 2201/003; H04R 7/10; H04R 19/04; H04R 19/005; H04R 31/003; H04R 10/04; B81C 2203/0127
USPC ........................................................ 257/416
See application file for complete search history.

(56) References Cited

U.S. PATENT DOCUMENTS

| | | |
|---|---|---|
| 2009/0086999 A1 | 4/2009 | Song |
| 2009/0101622 A1* | 4/2009 | Wang ...................... H01L 28/60 216/13 |

(Continued)

FOREIGN PATENT DOCUMENTS

| | | |
|---|---|---|
| CN | 102822084 | 12/2012 |
| TW | 201014780 | 4/2010 |

OTHER PUBLICATIONS

PCT/US14/53235 Written Opinion of the International Searching Authority mailed Nov. 25, 2014, 7 pages.

(Continued)

*Primary Examiner* — Caridad Everhart
(74) *Attorney, Agent, or Firm* — Foley & Lardner LLP

(57) ABSTRACT

A die is manufactured using complementary metal-oxide semiconductor (CMOS) techniques to create transistors, electrical pathways, and microelectromechanical system (MEMS) structures. The MEMS structures include springs, plates, mechanical stops, and structural supports, which can be combined to form complex MEMS structures including microphones, pressure sensors, accelerometers, resonators, gyroscopes, and the like.

5 Claims, 23 Drawing Sheets

Related U.S. Application Data

(60) Provisional application No. 61/871,957, filed on Aug. 30, 2013.

(56) References Cited

U.S. PATENT DOCUMENTS

| | | | |
|---|---|---|---|
| 2010/0052179 A1 | 3/2010 | Lan et al. | |
| 2010/0065931 A1 | 3/2010 | Shih | |
| 2010/0084723 A1 | 4/2010 | Chen et al. | |
| 2010/0213557 A1 | 8/2010 | Wang | |
| 2011/0008962 A1 | 1/2011 | Huang et al. | |
| 2011/0057288 A1* | 3/2011 | Tan | B81B 3/0072 257/503 |
| 2012/0319174 A1 | 12/2012 | Wang | |
| 2013/0334626 A1* | 12/2013 | Weber | B81B 3/0018 257/416 |
| 2014/0008740 A1 | 1/2014 | Wang et al. | |

OTHER PUBLICATIONS

U.S. Appl. No. 14/705,654 Notice of Allowance issued Aug. 4, 2015, 15 pages.

Taiwanese Application 103129852 Office Action dated Jan. 26, 2016, 6 pages.

Korean Application 10-2016-7005574 Notice of Allowance dated Mar. 25, 2016, 3 pages.

Taiwan Application 103129852 Notice of Allowance dated May 4, 2016, 3 pages, 2 pages.

\* cited by examiner

INTEGRATED CMOS/MEMS MICROPHONE DIE COMPONENTS

RELATED APPLICATIONS

This application claims the benefit of U.S. Provisional Patent Application 61/871,957, filed on Aug. 30, 2013, and Patent Cooperation Treaty Application PCT/US14/53235, filed on Aug. 28, 2014. These applications are hereby incorporated by reference in their entireties for all purposes.

BACKGROUND OF THE INVENTION

In the 1960s, practitioners in the field of microelectronics first developed techniques for fabricating tiny mechanical structures using a series of steps involving the depositing of layers of materials onto the surface of a silicon wafer substrate, followed by selectively etching away parts of the deposited materials. By the 1980s, the industry began moving toward silicon-based surface micromachining using polysilicon as the mechanical layer. However, although polysilicon has proven a useful building block in fabricating microelectromechanical systems (MEMS) because of its mechanical, electrical, and thermal properties, fabrication techniques used for polysilicon-based MEMS do not work well with fabrication techniques used for complementary metal-oxide semiconductor (CMOS) technology. As such, in the prior art, the circuitry for controlling the MEMS traditionally was fabricated on a separate die. While there has been some success in integrating CMOS and polysilicon fabrication on a single die, these hybrid CMOS-polysilicon devices have proven less than ideal because of long design times and complex fabrication requirements.

More recently, practitioners have attempted to fabricate MEMS structures using standard CMOS materials rather than the materials traditionally used in polysilicon-based MEMS structures. In standard CMOS fabrication, transistors are formed on the surface of a silicon wafer and electrical pathways are built above the transistors by repeatedly depositing and selectively removing layers of metallic and dielectric material. In an integrated CMOS/MEMS die, at the same time as the CMOS circuits are being interconnected on one part of the wafer, patterned layers of metallic and dielectric materials on another part of the wafer can form complex MEMS structures. Once all of the layers have been built up, the MEMS structure is "released"—that is, the sacrificial dielectric material around the MEMS structures is removed using an etchant such as vHF (vapor hydrofluoric acid), leaving the mechanical components of the MEMS structure free to move. Other sacrificial etchants can be used such as a wet "pad etch," plasma or RIE dry etching, or a combination of any of these. Certain sacrificial etchants attack the silicon nitride passivation. Polyimide, included in some CMOS processes on top of the passivation layer can mitigate the attack on the silicon nitride.

This simplifies the design and manufacturing since there is no need for the use of special procedures and materials to accommodate the disparate requirements of fabricating a hybrid CMOS-polysilicon die. However, as a structural building block, the metallic layers used in CMOS lack the stiffness required for use as structural MEMS components, and moreover, the thin metallic layers tend to curve after release. While it is possible to address these problems by building structures composed of stacked layers of metal having with metal vias connecting each metallic layer, many other problems remain unresolved.

First, while a multi-layer metallic MEMS structure may be rigid, in some instances the rigidity of a MEMS structure should be anisotropic (that is, rigid in one axis of movement and flexible in another axis of movement). For example, many MEMS structures use springs to control movement; using multiple layers of metal for a spring structure may create the extra stiffness that prevents the spring from curving, but the stiffness in the x-, y-, and z-axes may limit the structure's effectiveness as a spring.

Second, many types of MEMS require an airtight chamber after release, so either a cap wafer must be installed or else holes must be created in the top layer to allow the etchant to reach the dielectric material. In the former case, attaching a cap wafer requires non-standard CMOS processing and cost, makes access to the bonding pads more challenging, and adds height to the die. In the latter case, in order to seal the holes after the etching step, metal or other materials must be deposited, which risks inadvertent introduction of the sealing material into the interior of the chamber, potentially affecting the movement of the mechanical components.

Third, in order to remove the dielectric material, the vHF (or other sacrificial etchants) must come into physical contact with the material. For a narrow stacked structure, the vHF can readily remove the dielectric material. However, for a wide plate structure (for example, a microphone back plate), the vHF may take considerable time to reach the interior of the plate, and this may result in removal of more dielectric material than desired from other parts of the MEMS structure.

Fourth, for a wide plate structure, even after removal of the dielectric material between the metallic layers, the plate may have significant mass. This can lead to lower resonant frequencies, which can negatively impact the frequency response of the microphone.

Fifth, as noted above, single layers of metal are relatively weak. Where an unreinforced top metallic layer covers a sealed chamber containing the MEMS structure, the top layer may bow inward because of the vacuum within the chamber. Adding space between the MEMS structure and the top layer may keep the top layer from interfering with the MEMS structure, but the additional space increases the height of the die.

Sixth, when the surfaces of mechanical components of a MEMS structure come into contact with one another, adhesive surface forces, commonly known as "stiction," can cause the surfaces to become stuck to one another, compromising the mechanical functions of the device.

Therefore, there is an unmet need for structures and methods that address the known problems in fabricating integrated CMOS/MEMS dice.

SUMMARY OF THE INVENTION

In one embodiment of the present invention, the etchant is introduced into the interior of the die through a hole in the bottom of the wafer rather than introducing the etchant from the top side of the wafer. After completion of the etching step a sealing wafer, for example, silicon or glass, can be attached to the bottom of the wafer. This is simpler and less costly than adding a patterned cap wafer to the top of the wafer or taking the precautions necessary to prevent sealing material from entering the MEMS chamber through the holes in the top surface. Further, sealing the bottom of the wafer leaves the bonding pads on the top surface unaffected. Still further, the sealing wafer can be lapped after applying to thin the overall structure thickness.

In another embodiment of the present invention, a plate is made of multiple alternating layers of metal and dielectric material, with metal vias between the metallic layers. At least one of the metallic layers has a plurality of openings, such that when the etchant is introduced, it removes the dielectric material through the openings and quickly reaches and removes the dielectric material between the metallic layers. The resulting structure is easier to fabricate since the etchant reaches all of the dielectric material more quickly. Further, in comparison to a multilayer plate having continuous metallic layers, the inventive plate is nearly as stiff but significantly lower mass.

In another embodiment of the present invention, where the top metallic layer covers a sealed chamber containing the MEMS structure, structural supports running between the wafer and the top metallic layer provide support for the top metallic layer. These structural supports, which can be stand-alone pillars or they can be a part of the fixed portion(s) of the MEMS structure itself, provide support to the top metallic layer that might otherwise bow inward because of a vacuum within the chamber.

In another embodiment of the present invention, multiple alternating layers of metal and dielectric material, with metal vias between the layers of metal, make up a spring for a piston-type MEMS microphone diagram. The spring is much taller than it is wide, so that after the removal of the dielectric material between the layers, the spring is much stiffer in the vertical direction than in the horizontal direction; as such, in comparison to a diaphragm supported by an isotropic spring, the diaphragm supported by the inventive spring has roughly 50% more change in capacitance for a given acoustic signal.

In another embodiment of the present invention, multiple alternating layers of metal and dielectric material, with metal vias between the layers of metal, make up a piston-type MEMS microphone diagram. On one side of the diaphragm, the top metallic layer of the diaphragm is offset from a metallic layer of the adjacent support structure, such that when the diaphragm moves downward, the metallic layer of the diaphragm will come into contact with the metallic layer of the support structure, preventing further downward movement of the diaphragm. On another side of the diaphragm, the bottom metallic layer of the diaphragm is offset from a metallic layer of the adjacent support structure, such that when the diaphragm moves upward, the metallic layer of the diaphragm will come into contact with the metallic layer of the support structure, preventing further upward movement of the diaphragm.

In another embodiment of the present invention, some rows of vias may be formed without a layer of metal above them, looking effectively like stalagmites of a cave. Similarly, some rows of vias may be formed without a layer of metal below them, looking effectively like stalactites of a cave. When a moving component and a support structure component are offset with respect to one another, similarly to the previous embodiment, movement will be limited when a stalactite via comes into contact with a metallic layer below it, or when a stalagmite via comes into contact with a metallic layer above it. Or in another configuration, movement will be limited when a stalactite comes into contact with a stalagmite directly below it. Eliminating one or both metallic layers allows for a different range of movement of the device than in the previous embodiment where movement was stopped by metallic layer to metallic layer contact. Further, eliminating one or both metallic layers reduces the weight of the device. Further, since the contact area is only as wide as the vias rather than the entire metallic layer, the chance of stiction between the two components is greatly reduced.

DETAILED DESCRIPTION OF THE INVENTION

Figure 1:
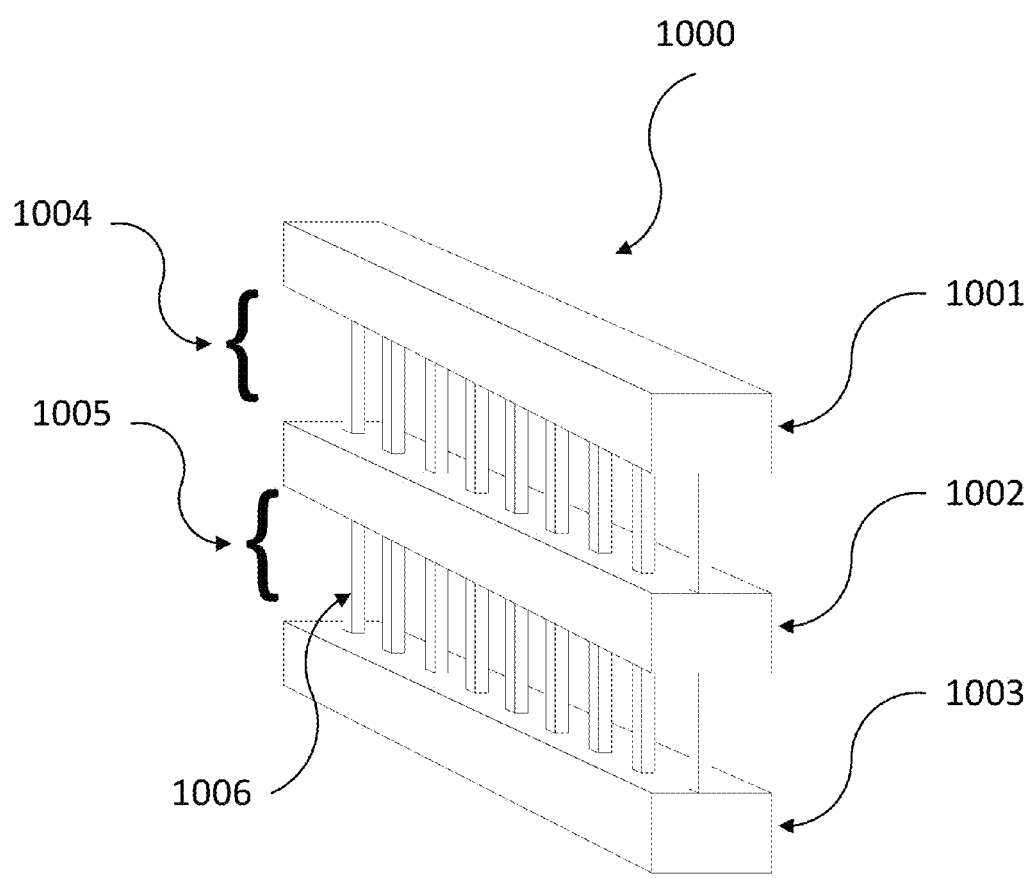
FIG. 1 is an angled view of a three-layer spring structure.

The following sections set forth numerous specific embodiments taking advantage of various aspects of the invention. These are not intended to be an exhaustive collection of every embodiment of the invention, as embodiments of the invention can be combined in a multiplicity of ways without departing from the principles of the invention.

General Fabrication Techniques

The embodiments disclosed can be fabricated using standard sub-micron CMOS fabrication techniques known to one of skill in the art, for example:

1. On the portions of a silicon wafer substrate intended to be populated by transistors, build the transistors using standard CMOS techniques. The portions of the wafer for the MEMS structures remain untouched, leaving the field oxide in this area.

2. Deposit a layer of $SiO_2$ over the entire wafer.

3. Apply a patterned mask onto the $SiO_2$ layer with openings for the electrical vias needed for the transistor interconnects and for the vias needed for the structure intermetal supports for the MEMS structure.

4. Etch the $SiO_2$ layer using reactive ion etching (RIE).

5. Fill the vias with tungsten using physical vapor deposition (PVD).

6. Planarize the layer using chemical-mechanical polishing (CMP).

7. Deposit an adhesion layer of Ti using sputtering.

8. Deposit a barrier layer of TiN using sputtering.

9. Deposit a metallic layer of Al/Cu alloy (1% Cu) using sputtering.

10. Apply a patterned mask onto the metallic layer to create interconnects for electrical pathways and for the MEMS structures.

11. Etch the metallic layer using RIE.

12. Repeat steps 2-11 for as many metallic layers as required.

13. Deposit a passivation layer of $Si_3N_4$, and pattern and dry etch openings in the passivation layer as needed.

14. Optionally, add a polyimide layer on top of the passivation and pattern openings as needed.

15. Optionally, create one or more openings through the silicon wafer beneath the MEMS structure.

16. Introduce vHF (or other etchant) through the openings of the passivation layer and/or silicon wafer to etch the $SiO_2$ portions of the MEMS structures. (The length of exposure to the vHF required to release the MEMS structures will vary according to the concentration of the vHF, the temperature and pressure, and the amount of $SiO_2$ to be removed.)

17. Dice the silicon wafer.

The dimensions of the various components can vary according to application requirements. For example, the metallic layers can range in thickness from approximately 0.5 µm to 1.0 µm, and each layer needn't be the same thickness as the other layers. The vias can range in from approximately 0.2 µm to 0.5 µm and be spaced apart from one another between approximately 0.5 µm to 5.0 µm, and the vias needn't be uniform in size or pitch. The vias on any given layer could be lined up in rows and columns or they could be offset from one another; the vias of one layer could be directly above the vias of the layer below or they could be offset from the vias of the layer below. The thickness of the $SiO_2$ between metallic layers can range from approximately 0.80 µm to 1.0 µm, and each layer of $SiO_2$ between metallic layers needn't be the same thickness as other layers of $SiO_2$.

Further, other materials common to CMOS fabrication may be used. Metals other than the Al/Cu (1%) alloy, such as copper or Al/Cu alloys of different proportions, may be used for the metallic layers. Dielectrics other than $SiO_2$, such as polymers, may be used for the intermetal layers and would likely require use of a different release etchant. A material other than silicon may be used for the wafer substrate, provided that it is otherwise compatible with the CMOS fabrication process.

Further, during the release step, in addition to controlling the depth of the etching through time, temperature, and pressure, the structure could include physical barriers that block the further penetration of the etchant.

Further, the foregoing list of steps can be altered to meet the requirements for the use of specific fabrication equipment, the fabrication requirements of the non-MEMS components of the die, and the fabrication requirements of specific MEMS structures. The following sections describe examples of additional fabrication requirements for specific MEMS structures.

Anisotropic MEMS Spring Structure

In a preferred embodiment of MEMS spring structure 1000, shown in FIG. 1, each of the metallic layers 1001, 1002, and 1003 are approximately 1.0 µm wide and approximately 0.555 µm thick, and are composed of aluminum. In between metallic layers 1001, 1002, and 1003 are intermetal layers 1004 and 1005, which are approximately 1 µm wide and 0.850 µm thick. Vias 1006 are approximately 0.26 µm square, are spaced approximately at 1.0 µm intervals, and are composed of tungsten.

Spring structure 1000 is fabricated using standard sub-micron CMOS fabrications techniques, for example, as disclosed above under "General Fabrication Techniques."

The following table compares spring structure 1000 to a solid metal structure of the same dimensions:

|  | Structure 1000 | Comparable Solid Beam |
| --- | --- | --- |
| Moment of Inertia (Z) | 2.234 | 3.175 |
| Moment of Inertia (Y) | 0.139 | 0.280 |
| Ratio of Z to Y Stiffness | 16.1:1 | 11.3:1 |

Figure 2:
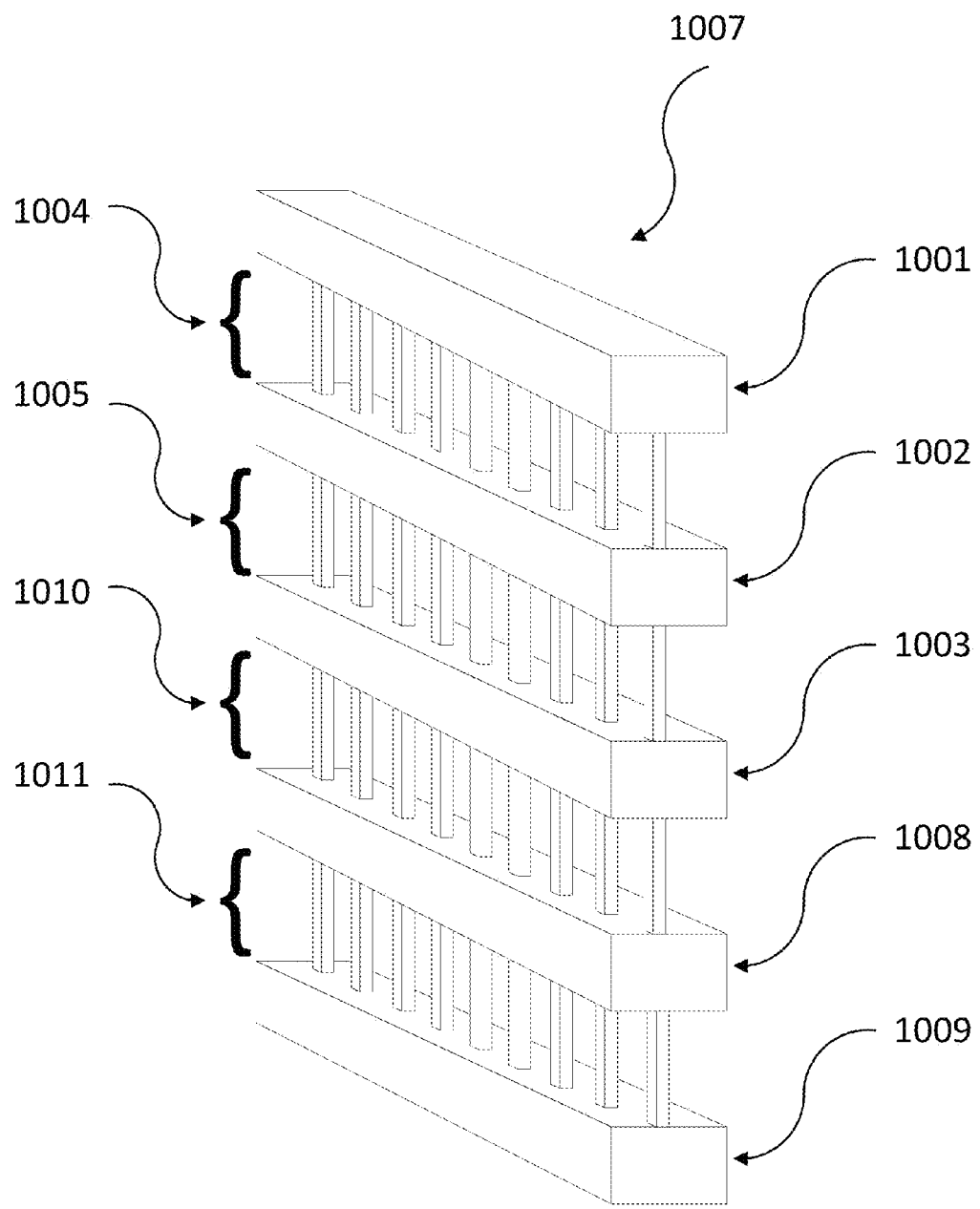
FIG. 2 is an angled view of a five-layer spring structure.

FIG. 2 shows spring structure 1007, comparable to spring structure 1000 except that spring structure 1007 consists of two additional metallic layers 1008 and 1009 and two additional intermetal layers 1010 and 1011. The following table compares spring structure 1007 to a solid metal structure of the same dimensions:

|  | Structure 1006 | Comparable Solid Beam |
| --- | --- | --- |
| Moment of Inertia (Z) | 11.027 | 19.621 |
| Moment of Inertia (Y) | 0.231 | 0.514 |
| Ratio of Z to Y Stiffness | 47.7:1 | 38.1:1 |

Depending on the purpose of the spring structure in the MEMS device, the length of the metallic layers may vary. For example, when used to support a piston-style diaphragm in a MEMS microphone die, it may be approximately 100 µm, but when used for other applications, such as an accelerometer or valve, its length would differ according to the configuration of the device and the mass of the moving component. Likewise, number of metallic layers and/or the width of the spring can be changed to increase or decrease the stiffness of the spring as needed for the purpose of the spring in the MEMS device. Generally, the stiffness of the spring will vary with the third power of the length (inversely), linearly with the width, and with the third power of the height.

Vacuum Sealed MEMS Die

Figure 3:
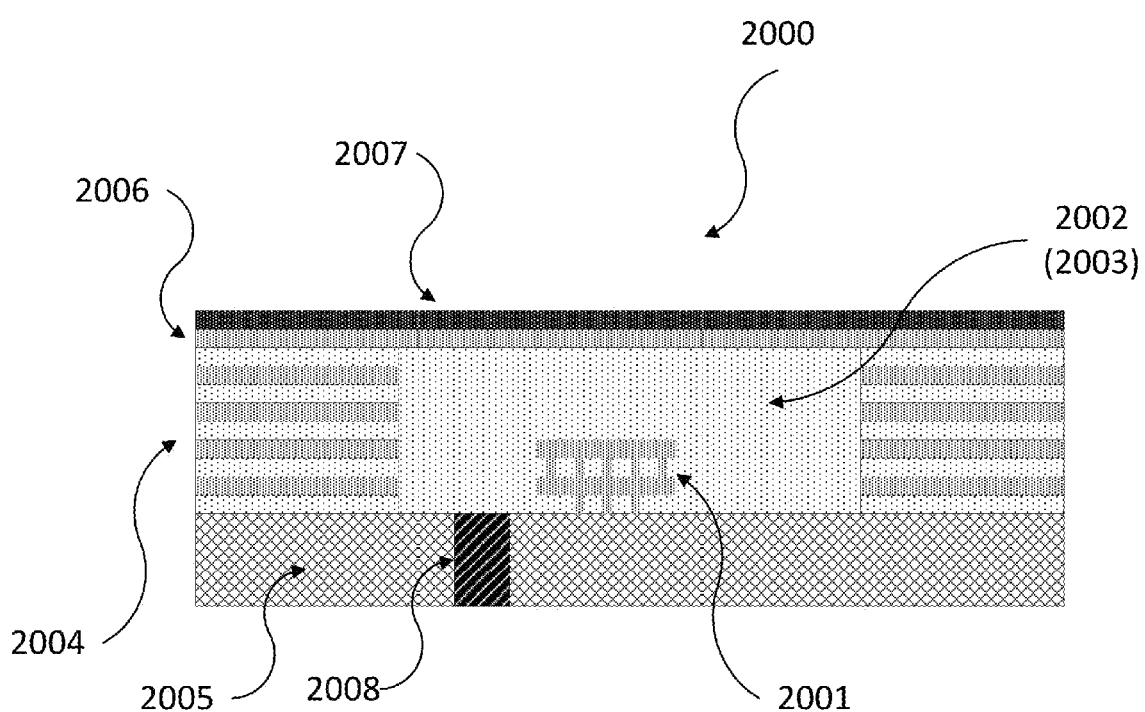
FIG. 3 is cross section view of a vacuum-sealed die before release.
Figure 4:
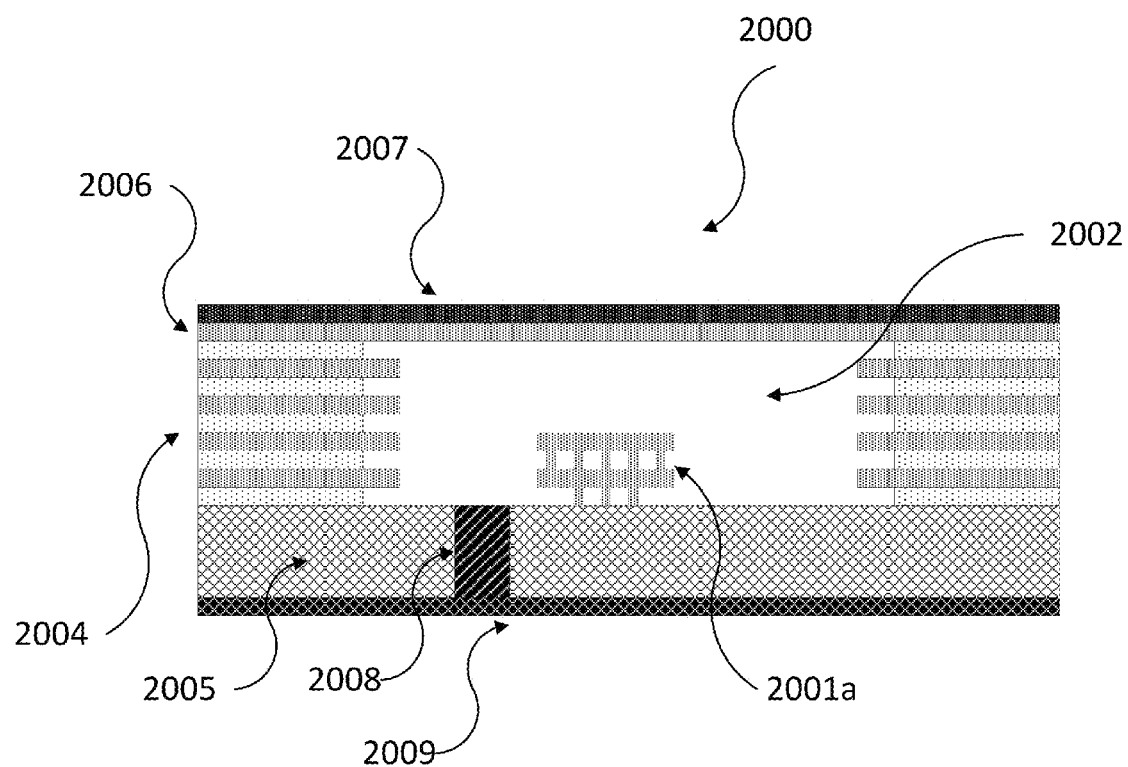
FIG. 4 is a cross section view of a vacuum-sealed die after release.

In a preferred embodiment of vacuum sealed MEMS die 2000, shown in cross-section before release in FIG. 3 and after release and capping in FIG. 4, layers of metal and unreleased dielectric material making up an unreleased MEMS structure 2001 residing in chamber 2002. MEMS structure 2001 could be, for example, an accelerometer, resonator, gyroscope, or other structure. Prior to release, layers of dielectric material 2003 fill the empty space in chamber 2002. Support structure 2004, which may be made of layers of metal and dielectric materials, surrounds chamber 2002, and support structure 2004 may have other features and purposes that are not relevant for describing this embodiment. Structures 2001 and 2004 and dielectric material 2003 all sit above wafer 2005. Metallic layer 2006, composed of a 1.0 µm-thick layer of aluminum, has been deposited on top of support structure 2004 and chamber 2002. Passivation layer 2007, composed of $Si_3N_4$, has been deposited on top of metallic layer 2006. An opening 2008 runs through wafer 2005 into chamber 2002.

After fabricating unreleased structure 2001 in MEMS die 2000 an etchant is introduced into chamber 2002 through opening 2008. The etchant removes the dielectric material 2003 in chamber 2002, including any exposed dielectric material in now-released MEMS structure 2001a and in support structure 2004. The extent of etching of the dielectric in support structure 2004 is controlled by etch time. As shown FIG. 4, after release, a silicon sealing wafer 2009 has been bonded to the bottom of wafer 2005.

Vacuum sealed MEMS device 2000 is fabricated using the standard sub-micron CMOS fabrications techniques, for example, as disclosed above under "General Fabrication Techniques," with the following change:

17. In a vacuum, attach a silicon sealing wafer to the bottom of the die wafer using techniques such as electrostatic bonding, eutectic bonding, or glass frit.

18. Reduce the thickness of the sealing wafer to approximately 100 µm, using techniques such as grinding, lapping, polishing, chemical-mechanical polishing (CMP), or combinations of these techniques.

19. Dice the silicon wafer.

Lightweight-but-Rigid Capacitive Sensor Plates

Figure 5:
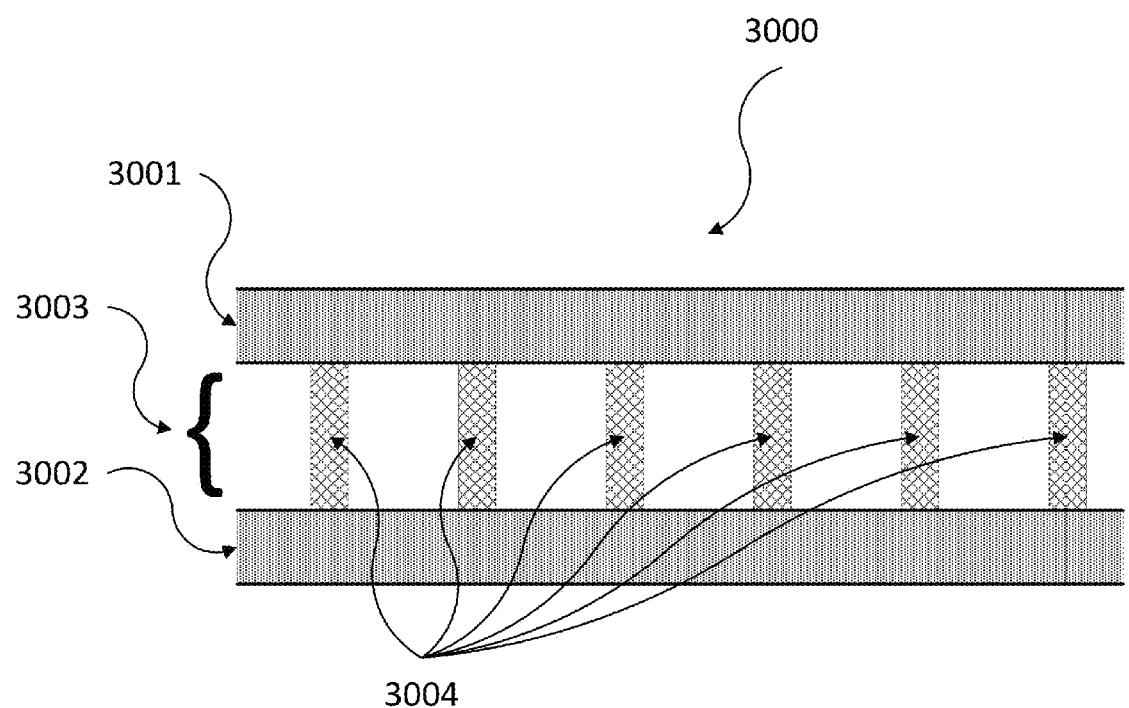
FIG. 5 is a cross section view of a portion of a rigid capacitive sensor plate.
Figure 6:
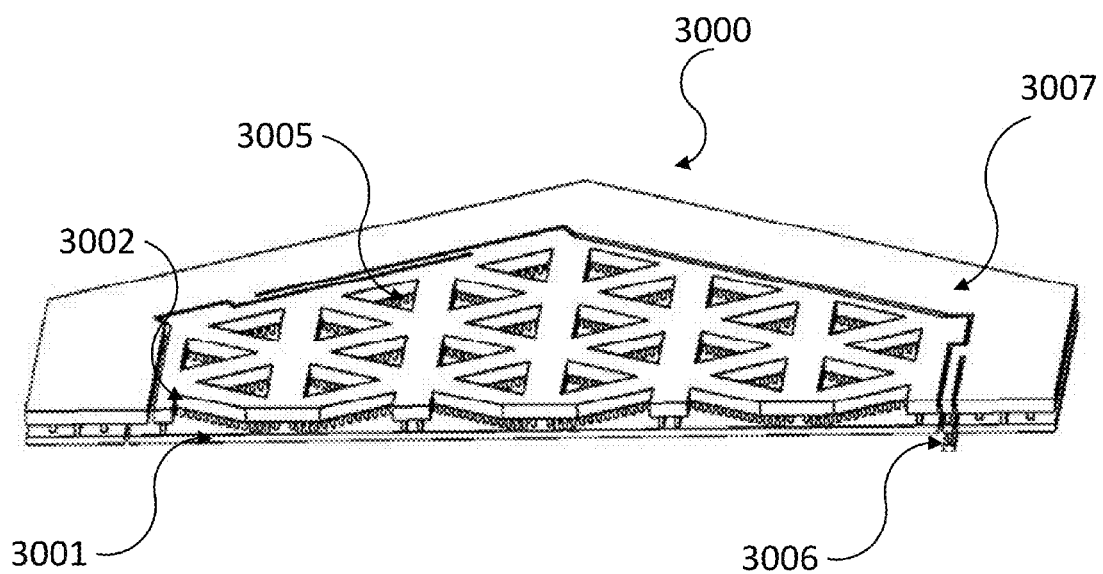
FIG. 6 is an angled view of a rigid capacitive sensor plate used as a diaphragm in a piston-type capacitive microphone.

With the lightweight-but-rigid capacitive sensor plate 3000 partially shown in FIG. 5, each of the metallic layers 3001 and 3002 are approximately 0.5 µm thick, and are preferably composed of an aluminum/copper alloy. In between metallic layers 3001 and 3002 is intermetal layer 3003, which is approximately 0.850 µm thick and typically composed of silicon oxide. Tungsten vias 3004 are approximately 0.26 µm square, are spaced approximately at 1.0 µm intervals, and are between metallic layers 3001 and 3002. As shown in FIG. 6, individual metallic layer 3001 is a solid hexagon approximately 600 µm wide, while individual metallic layer 3002 is similarly shaped and sized but is latticed, having equilateral triangular openings 3005, approximately 10 µm in size and spaced throughout.

Sensor plate 3000 is fabricated using the standard sub-micron CMOS fabrications techniques, for example, as disclosed above under "General Fabrication Techniques."

As suggested by FIG. 6 sensor plate 3000 is ideal for use as a diaphragm in a piston-type capacitive microphone when connected by springs 3006 to support structure 3007. As it includes metallic layers 3001 and 3002, no additional conductive material must be deposited for it to act as one of the capacitive plates. Further, because it has metallic layers 3001 and 3002 which are connected by vias 3004, it will effectively function as a solid component, and yet, because during release intermetal layer 3003 is removed through triangular openings 3005, it is significantly lighter and has higher resonant frequencies than a solid component.

The shape and size of the plate may be varied according to the application for the plate. For example, when used as a back plate of a capacitive sensor, it may be rectangular and extend into the walls of a supporting structure surrounding the sensor structure. Further, when used as a back plate of a capacitive sensor, metallic layer 3001 could be perforated to be acoustically transparent; alternatively, openings 3005 could extend through metallic layer 3001. Further, the shape of the openings 3005 in metallic layers 3001 and/or 3002 could be any regular or irregular polygon, circle, or oval, the shape of the plate could be any regular or irregular polygon, circle, or oval, and the plate could include additional metallic layers.

Mechanical Stops

Figure 7:
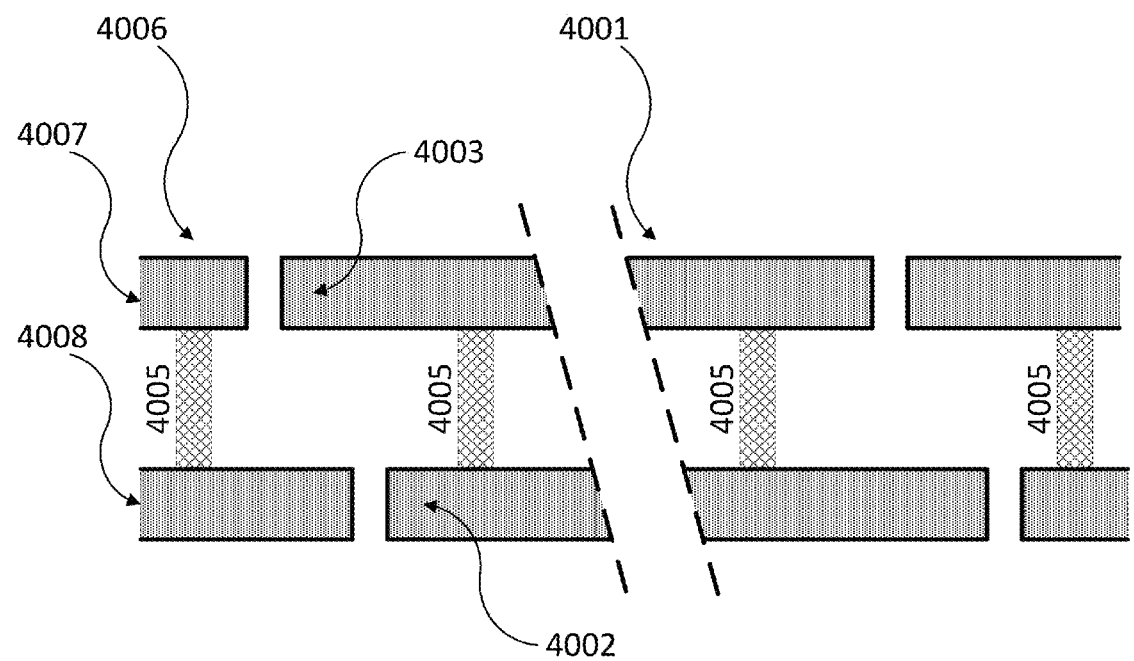
FIG. 7 is a cross section view of mechanic stops built into a movable MEMS structure (at rest).

In the preferred embodiment of mechanical stops 4000a and 4000b of capacitive sensor diaphragm 4001, shown in FIG. 7, the edges of each side of bottom metallic layer 4002 of diaphragm 4001 are slightly offset (approximately 10 µm) from the edges of each side of top metallic layer 4003 in an alternating pattern around the hexagonally-shaped sensor diaphragm 4001. That is, on three sides, the edges of metallic layer 4002 extend beyond metallic layer 4003, and on the other three sides, the edges of metallic layer 4003 extend beyond metallic layer 4002. Metallic layers 4002 and 4003 are approximately 0.5 µm thick, and are composed of an aluminum/copper alloy. In between metallic layers 4002 and 4003 is intermetal layer (not shown, removed during release etch), which is approximately 0.850 µm thick. A plurality of tungsten vias 4005, approximately 0.26 µm square, are spaced approximately at 1.0 µm intervals between metallic layers 4002 and 4003.

In a pattern opposite that of the edges of metallic layers 4002 and 4003 of sensor diaphragm 4001, support structure 4006 includes at least two metallic layers 4007 and 4008 with offset edges adjacent to the offset edges of metallic layers 4002 and 4003. That is, on three sides, the edges of metallic layer 4007 extend beyond metallic layer 4008, and on the other three sides, the edges of metallic layer 4008 extend beyond metallic layer 4007, such that the edges of metallic layers 4007 and 4008 act as mechanical stops that prevent excessive movement of sensor diaphragm 4001.

Figure 8:
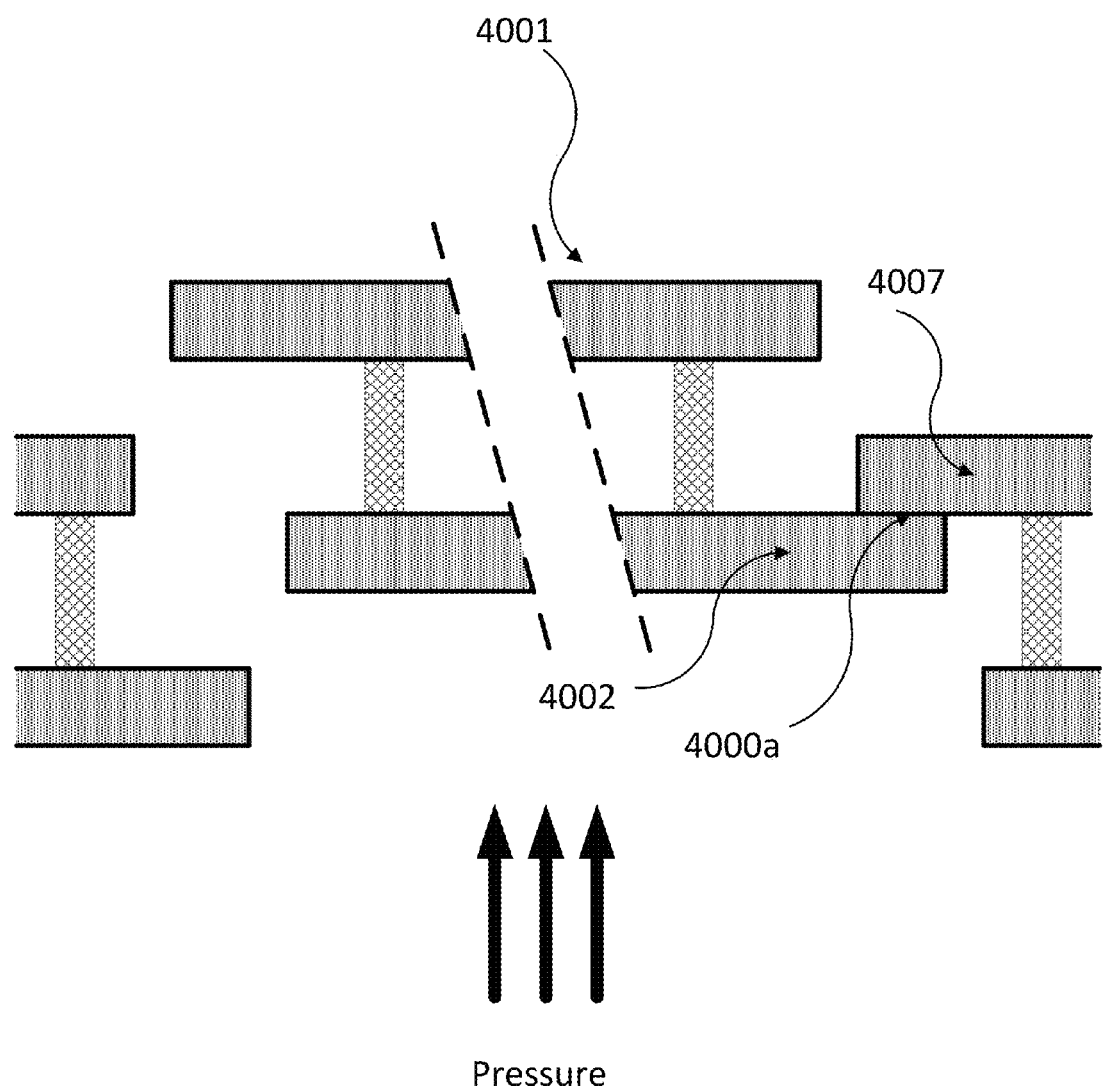
FIG. 8 is a cross section view of mechanical stops built into a movable MEMS structure (extended to the upward stop point).
Figure 9:
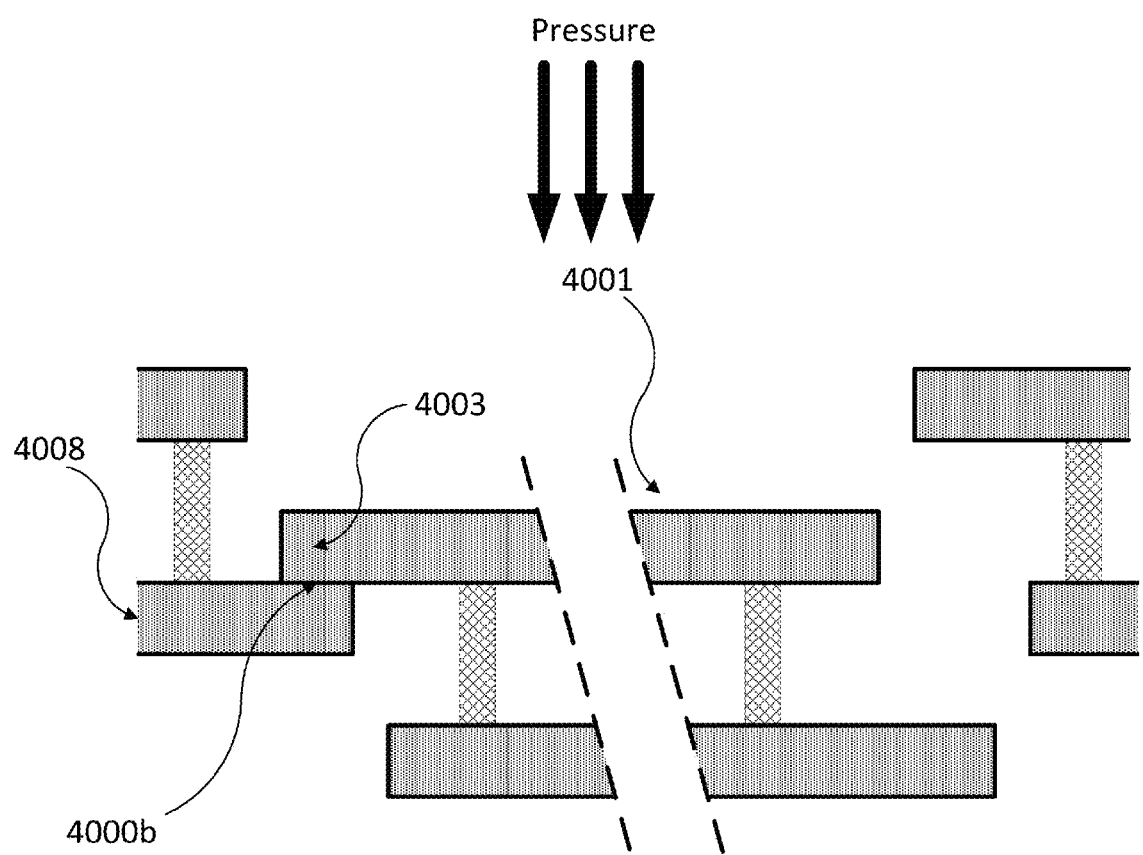
FIG. 9 is a cross section view of mechanical stops built into a movable MEMS structure (extended to the downward stop point).

Referring now to FIG. 8, when pressure moves sensor diaphragm 4001 upward, the top of metallic layer 4002 comes into contact with the bottom of metallic layer 4007 to create a mechanical stop 4000a, stopping further upward movement of sensor diaphragm 4001. As shown in FIG. 9, when pressure moves sensor diaphragm 4001 downward, the bottom of metallic layer 4003 comes into contact with the top of metallic layer 4008 to create a mechanical stop 4000b, stopping further downward movement of sensor diaphragm 4001.

A sensor with mechanical stops 4000a and 4000b can be fabricated using the standard sub-micron CMOS fabrications techniques, for example, as disclosed above under "General Fabrication Techniques."

Figure 10:
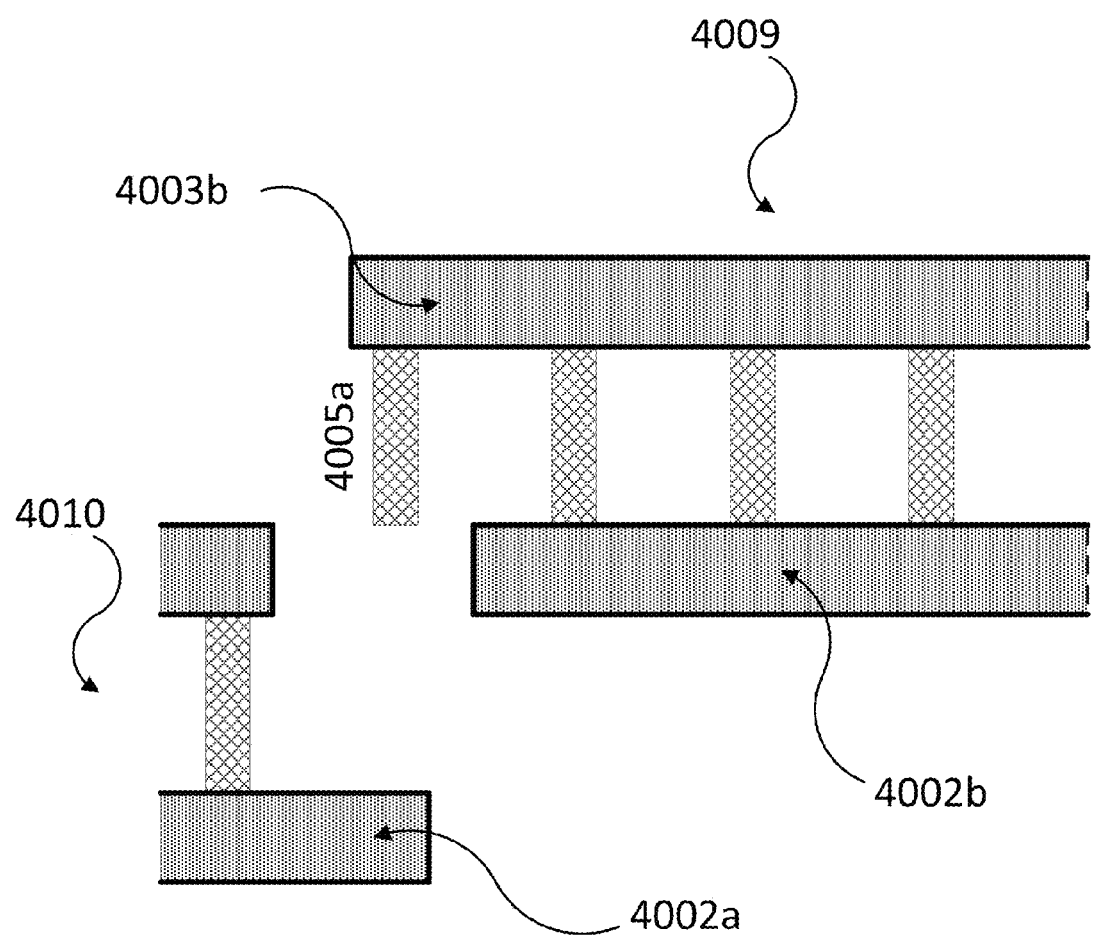
FIG. 10 is a cross section view of mechanical stops built from vias and a metallic layer (at rest).

In another preferred embodiment, metallic layer 4003b of cantilever 4009, shown in FIG. 10, includes a row of vias 4005a extending downward from metallic layer 4003b, but metallic layer 4002b does not extend to the bottom of vias 4005a, such that vias 4005a resemble stalactites in a cave. All metallic layers are 0.5 µm thick, and are composed of an aluminum/copper alloy. In between metallic layers is an intermetal layer (not shown, removed during release etch), which is approximately 0.850 µm thick. All vias are approximately 0.26 µm square and are spaced approximately at 1.0 µm intervals between metallic layers.

Figure 11:
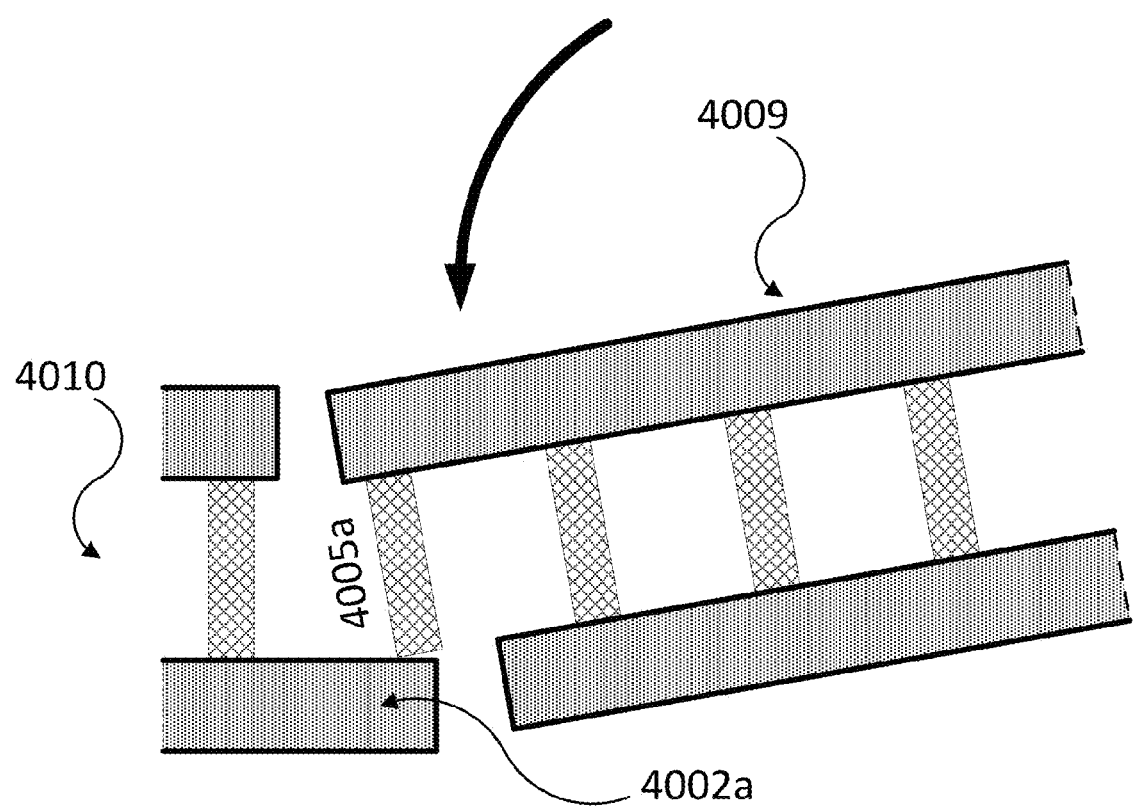
FIG. 11 is a cross section view of mechanical stops built from vias and a metallic layer (extended to the stop point).
Figure 12:
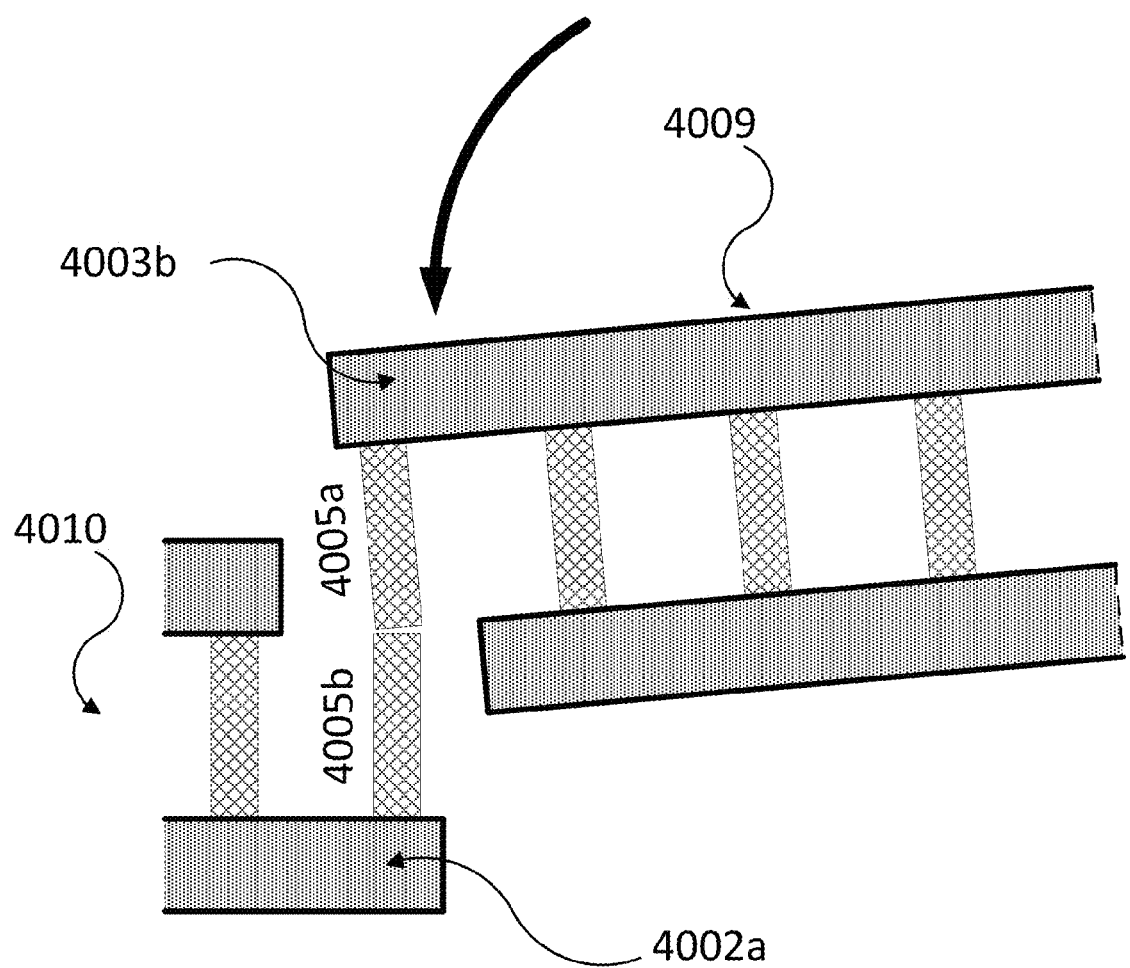
FIG. 12 is a cross section view of mechanical stops built from opposing vias (extended to the stop point).

As shown in FIG. 11, when cantilever 4009 bends downward towards component 4010, its movement is limited when vias 4005a come into physical contact with metallic layer 4002a on component 4010. In a variation on this embodiment, shown in FIG. 12, rows of vias 4005a extend downward from metallic layer 4003b, while rows of vias 4005b extend upward from metallic layer 4002a. When cantilever 4009 bends downward towards component 4010, its movement is limited when vias 4005a come into physical contact with vias 4005b.

Figure 13:
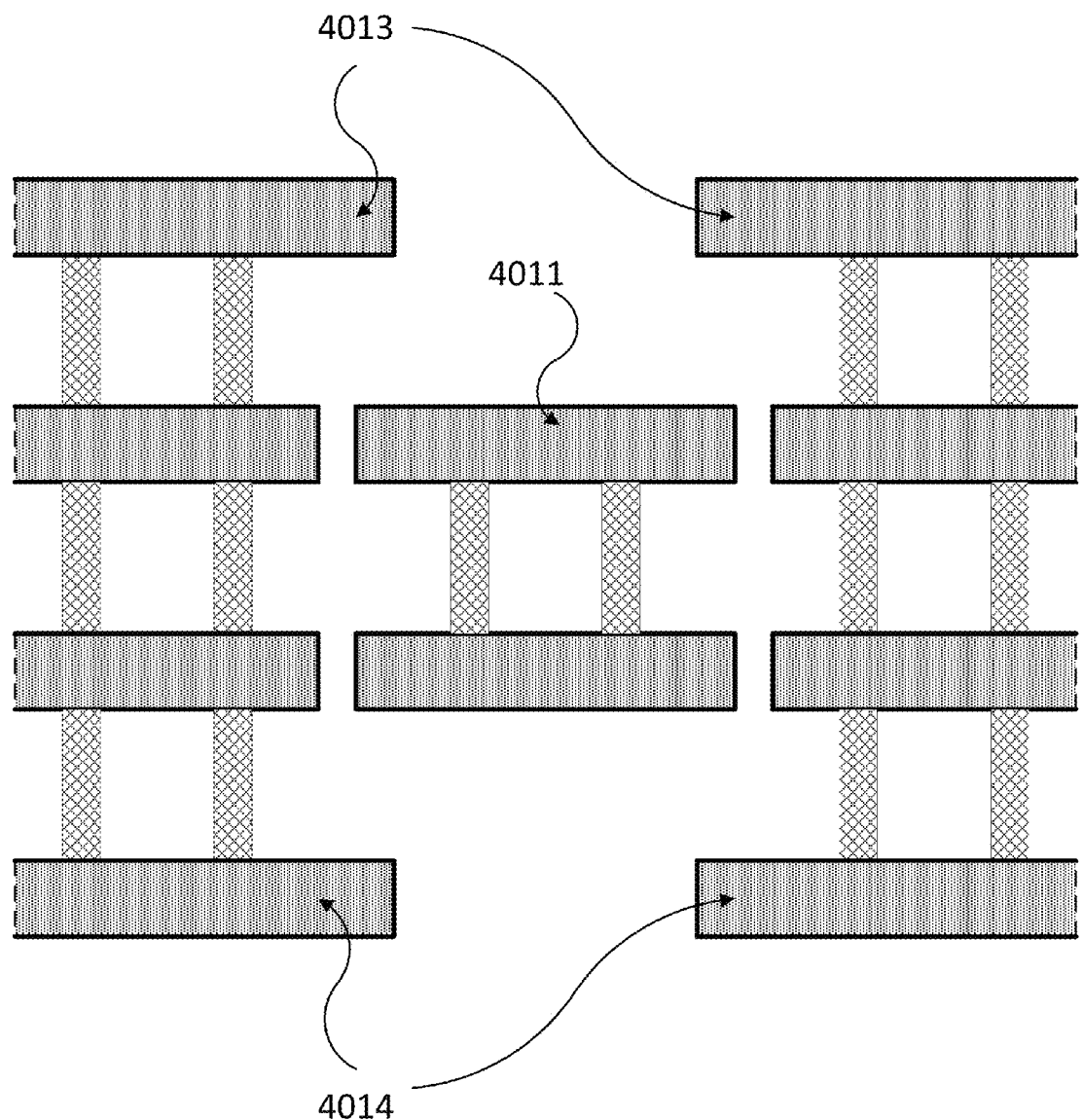
FIG. 13 is a cross section view of mechanical stops built without the use of offset metallic layers.

In another preferred embodiment, shown in FIG. 13, upward movement of moveable component 4011 will be limited when the top metallic layer of component 4011 comes into contact with the mechanical stops of metallic layer 4013. Likewise, downward movement of component 4011 will be limited when the bottom metallic layer comes into contact with the mechanical stops of metallic layer 4014. In this configuration, the edges of the top and bottom metallic layers of component 4011 need not be offset from one another.

A sensor with mechanical stops is fabricated in part using the standard sub-micron CMOS fabrications techniques, for example, as disclosed above under "General Fabrication Techniques." However, standard CMOS fabrication "rules" would not normally allow vias without metallic layers above and below, and so the rules would need to be overridden during fabrication (there is nothing that physically prohibits fabricating such vias).

While the embodiments of FIG. 7 through FIG. 12 depict the use of the inventive mechanical stops in the context of a piston-type capacitive sensors and cantilevers, similar mechanical stops could be used to limit the movement of other mechanical components within a MEMS structure. By way of example and not limitation, the stops of any of these embodiments could be used to limit the motion of diaphragms, springs, plates, cantilevers, valves, mirrors, microgrippers, and so forth.

Structural Supports for a MEMS Device

Figure 14:
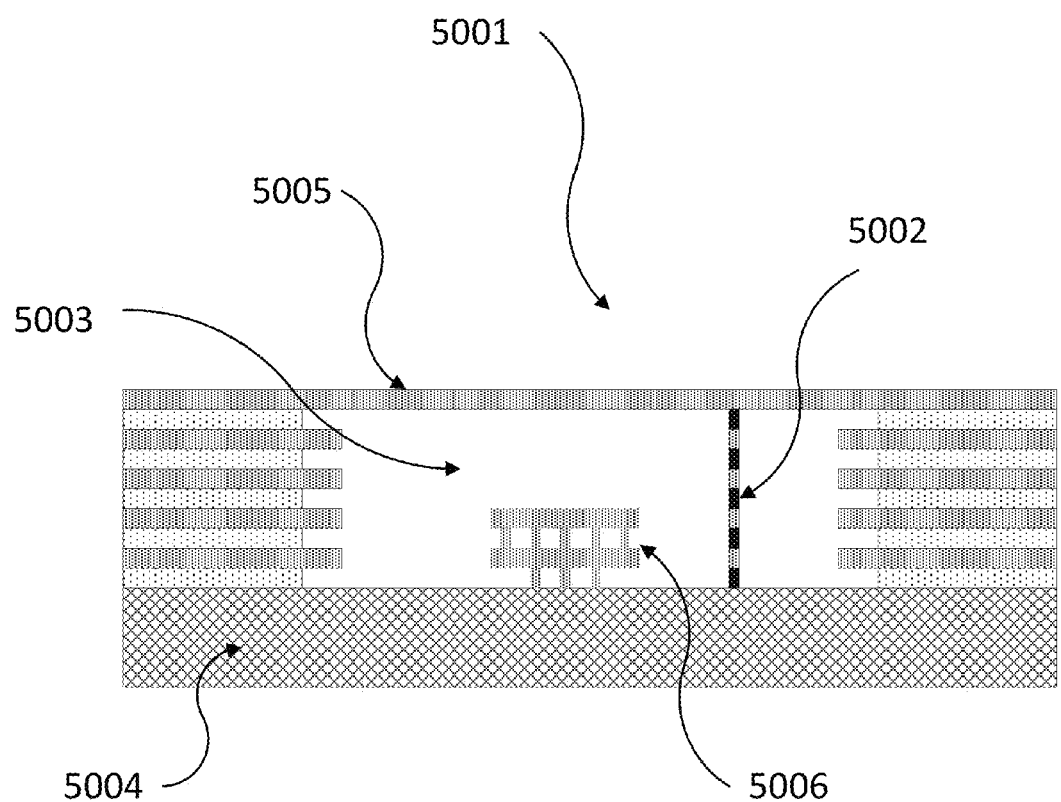
FIG. 14 is a cross section view of a structural support pillar comprising a single via series.

In a first preferred embodiment of a structural support for a MEMS die 5001, shown in FIG. 14, a support structure 5002, approximately 0.26 µm square and composed of patches of metallic layers with a single column of aligned vias tungsten, resides in chamber 5003, and is formed between device wafer 5004 and metallic layer 5005. Chamber 5003 extends between die wafer 5004 and metallic layer 5005. A MEMS structure 5006 (shown in outline), also resides within the chamber.

Figure 15:
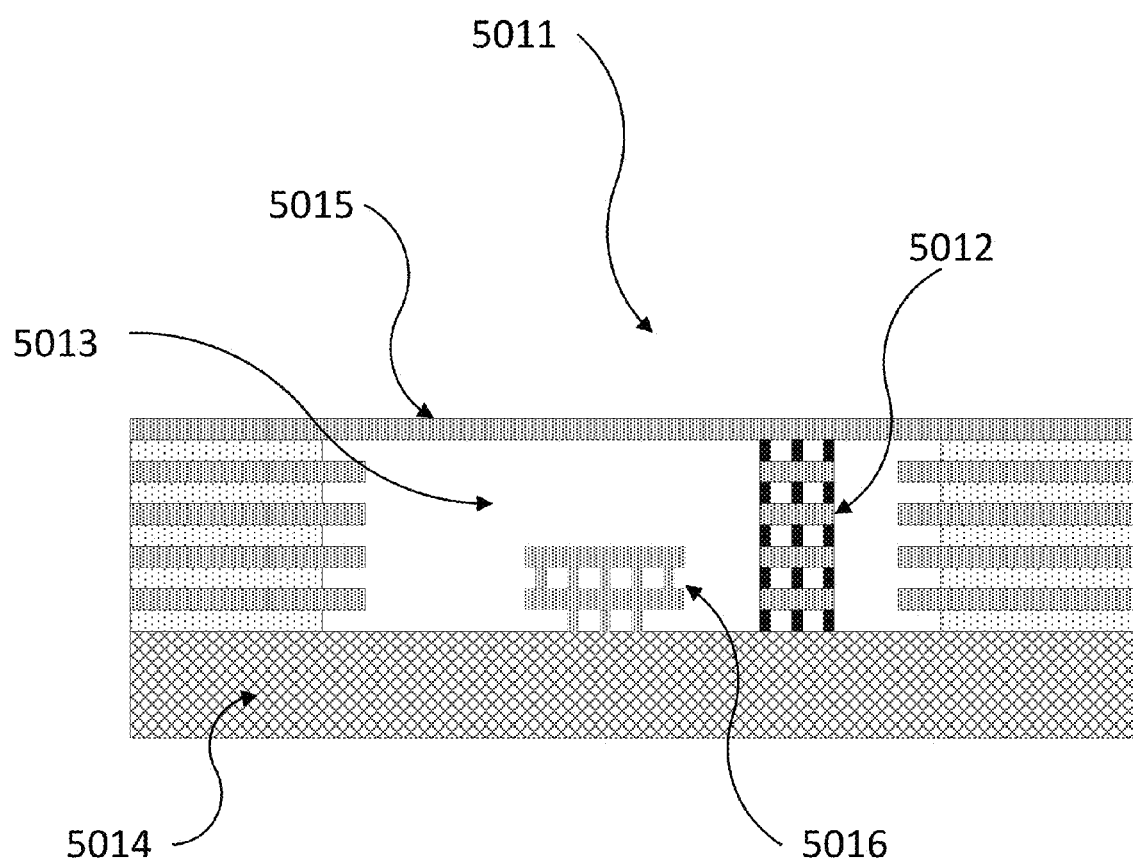
FIG. 15 is a cross section view of a structural support pillar comprising a plurality of metallic layers and a plurality of vias.

In a second preferred embodiment of structural support for a MEMS die 5011, shown in FIG. 15, a support pillar 5012, composed of alternating metallic and intermetal layers (not shown, removed during release etch), with metal vias between the metallic layers, resides in a chamber 5013, and is formed between die wafer 5014 and metallic layer 5015. Chamber 5013 extends between die wafer 5014 and metallic layer 5015. The metallic layers of pillar 5012 are between approximately 1 µm and 5 µm square and approximately 0.555 µm thick, and are composed of aluminum. The intermetal layers of pillar 5012 are approximately 0.850 µm thick. The vias of pillar 5012 are approximately 0.26 µm square, are spaced approximately at 1.0 µm intervals, and are composed of tungsten. The number of vias between each metallic layer may be varied to achieve the necessary strength of the pillar. A MEMS structure 5016 (shown in outline), also resides within the chamber.

Figure 16:
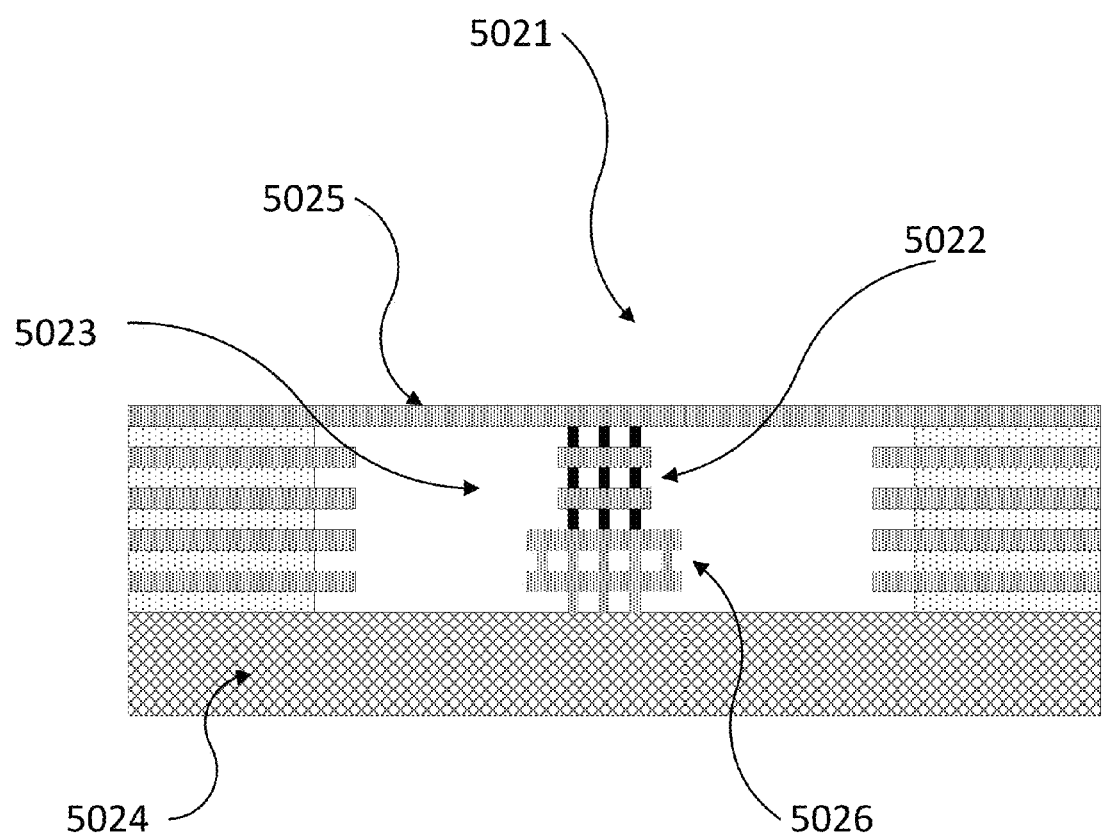
FIG. 16 is a cross section view of a structural support pillar integrated into a MEMS structure.

In a third preferred embodiment of structural support for a MEMS die 5021, shown in FIG. 16, a support pillar 5022, composed of alternating metallic and intermetal layers (not shown, removed during release etch), with metal vias between the metallic layers, resides in a chamber 5023, and is formed between a fixed portion of MEMS structure 5026 (shown in outline) and metallic layer 5015. Chamber 5023 extends between die wafer 5024 and metallic layer 5025. The metallic layers of pillar 5022 are approximately 1 µm and 5 µm square and 0.5 µm thick, and are composed of aluminum. The intermetal layers of pillar 5022 are approximately 0.850 µm thick. The vias of pillar 5022 are approximately 0.26 µm square and composed of tungsten.

Support via 5002, pillar 5012, and pillar 5022 are fabricated using the standard sub-micron CMOS fabrications techniques, for example, as disclosed above under "General Fabrication Techniques." The specific shapes, locations, and number of supports 5002, 5012, and 5022 can be varied according to the shape, location, and purpose of the MEMS structures 5006, 5016, and 5026.

Exemplar Application—Capacitive Microphone

Figure 17:
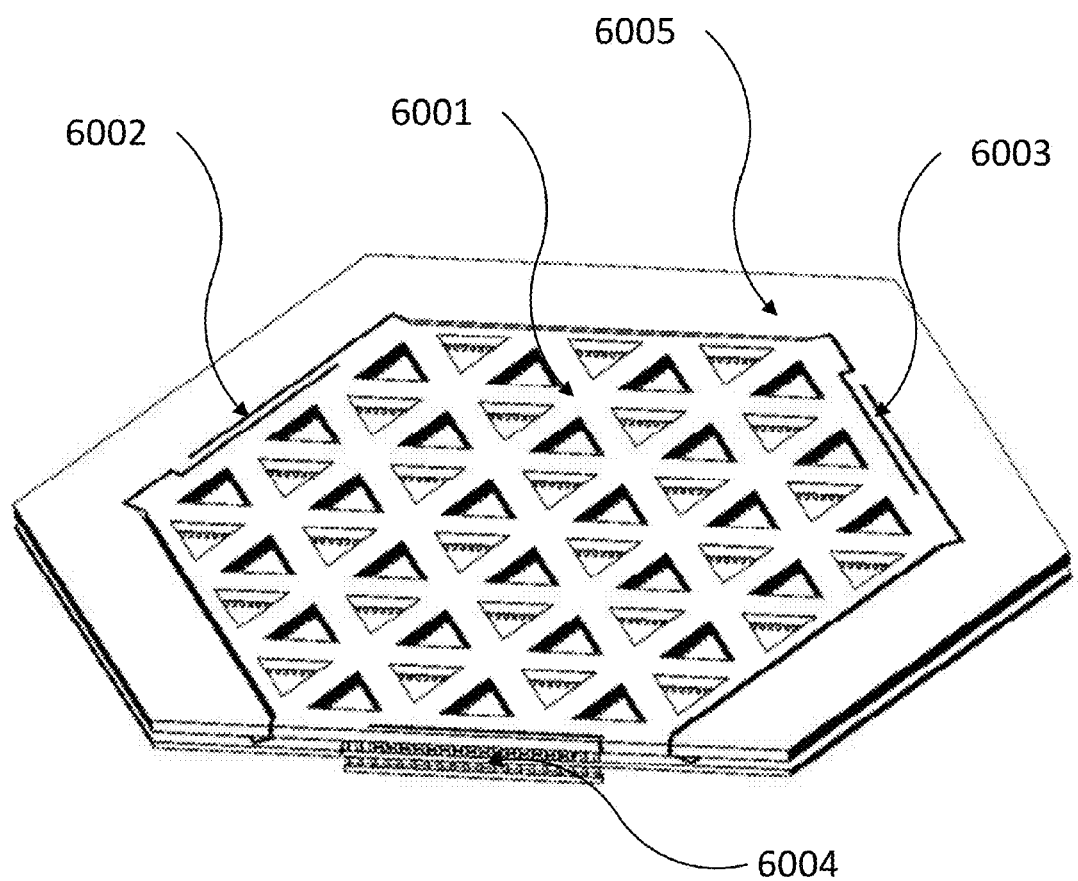
FIG. 17 is an angled view of the diaphragm of an exemplar MEMS microphone die fabricated using the inventive structures and methods.
Figure 18:
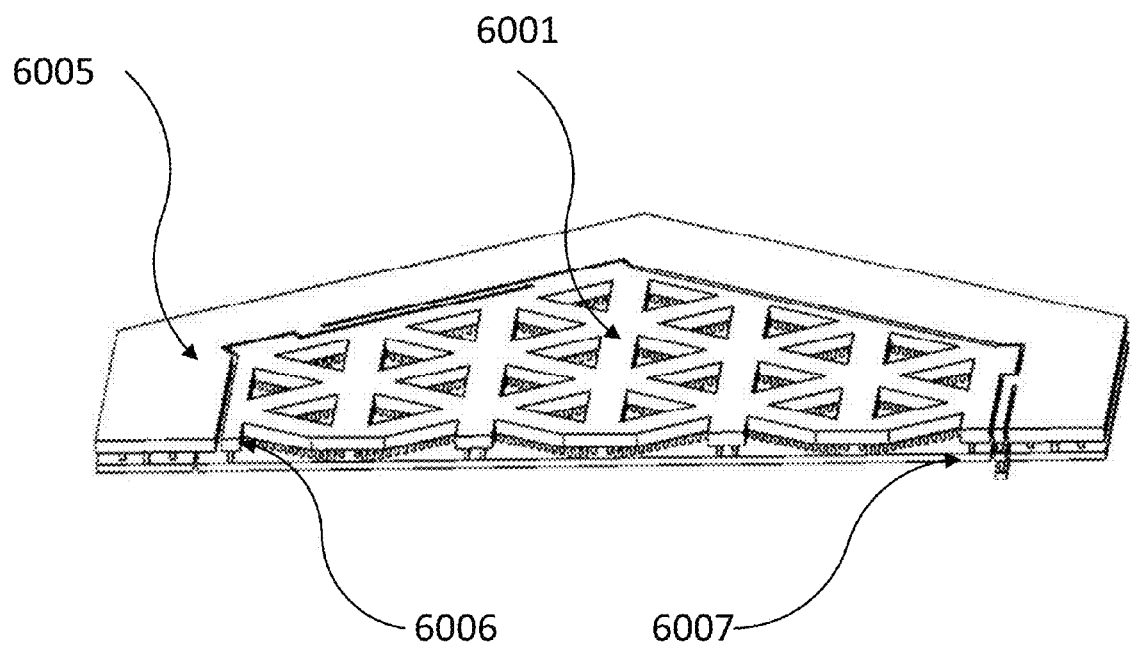
FIG. 18 is a second angled view of the diaphragm of an exemplar MEMS microphone die fabricated using the inventive structures and methods.
Figure 19:
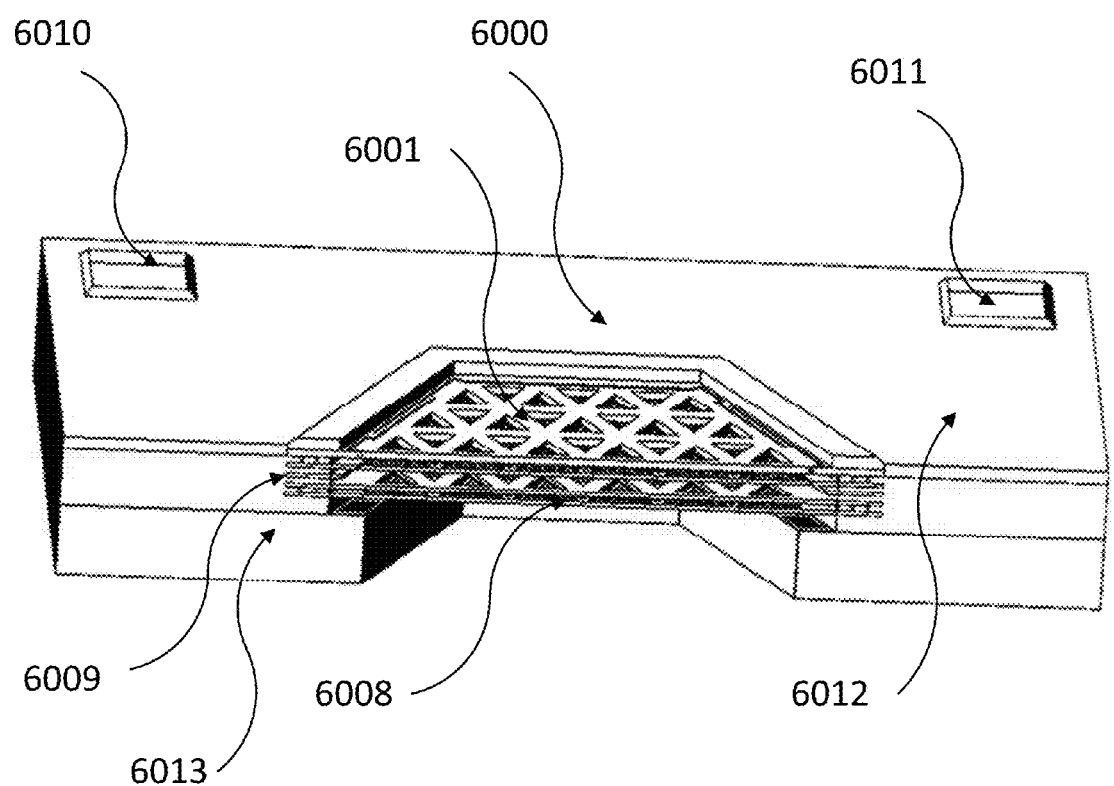
FIG. 19 is an angled view of an exemplar MEMS microphone die fabricated using the inventive structures and methods.

FIG. 17, FIG. 18, and FIG. 19 show views of an embodiment of a MEMS capacitive microphone die 6000 fabricated using some of the inventive methods and structures. Hexagonal diaphragm 6001 has been built with a solid metallic layer, a lattice metallic layer, and a plurality of metal vias between the two metallic layers. Springs 6002, 6003, and 6004 attach diaphragm 6001 to a support structure 6005 which surrounds diaphragm 6001. Springs 6002, 6003, and 6004, built with three metallic layers each, have a width to height ratio of approximately 1.0:3.6. Diaphragm 6001 and support structure 6005 include pressure stops 6006 and 6007. Back plate 6008 has been built with two lattice metallic layers, with a plurality of metal vias between the two layers. Guard electrode 6009, in between diaphragm 6001 and back plate 6008, is driven by the CMOS circuit to minimize stray coupling capacitance existing in the support structure between the diaphragm and back plate. Pads 6010 and 6011 provide the electrical connection between the die and external circuitry. Area 6012 (the portion of the die not occupied by the MEMS structure) contains CMOS circuitry supporting the operation of the microphone (for example, voltage control, amplifiers, A/D converters, and the like).

In operation, as sound waves strike diaphragm 6001, diaphragm 6001 moves up and down like a piston within the structure 6005, changing the capacitance between diaphragm 6001 and back plate 6008. Springs 6002, 6003, and 6004 act to restore the position of diaphragm 6001 in between wave fronts. Pressure stops 6006 and 6007 limit the movement of diaphragm 6001 in response to excess pressure or physical shock.

In this embodiment, back plate 6008 is positioned above substrate 6013, with diaphragm 6001 positioned above back plate 6008. Alternatively, microphone die 6000 could have been fabricated such that diaphragm 6001 is positioned above substrate 6013, with back plate 6008 positioned above diaphragm 6001. In either embodiment, the sound waves would strike diaphragm 6001 either from the top or from the bottom, depending on how microphone die 6000 is mounted in the microphone package. Various configurations for mounting microphone die 6000 in a package are disclosed, for example, in U.S. Pat. No. 8,121,331, which is incorporated by reference in its entirety.

Exemplar Application—Resonator

Figure 20:
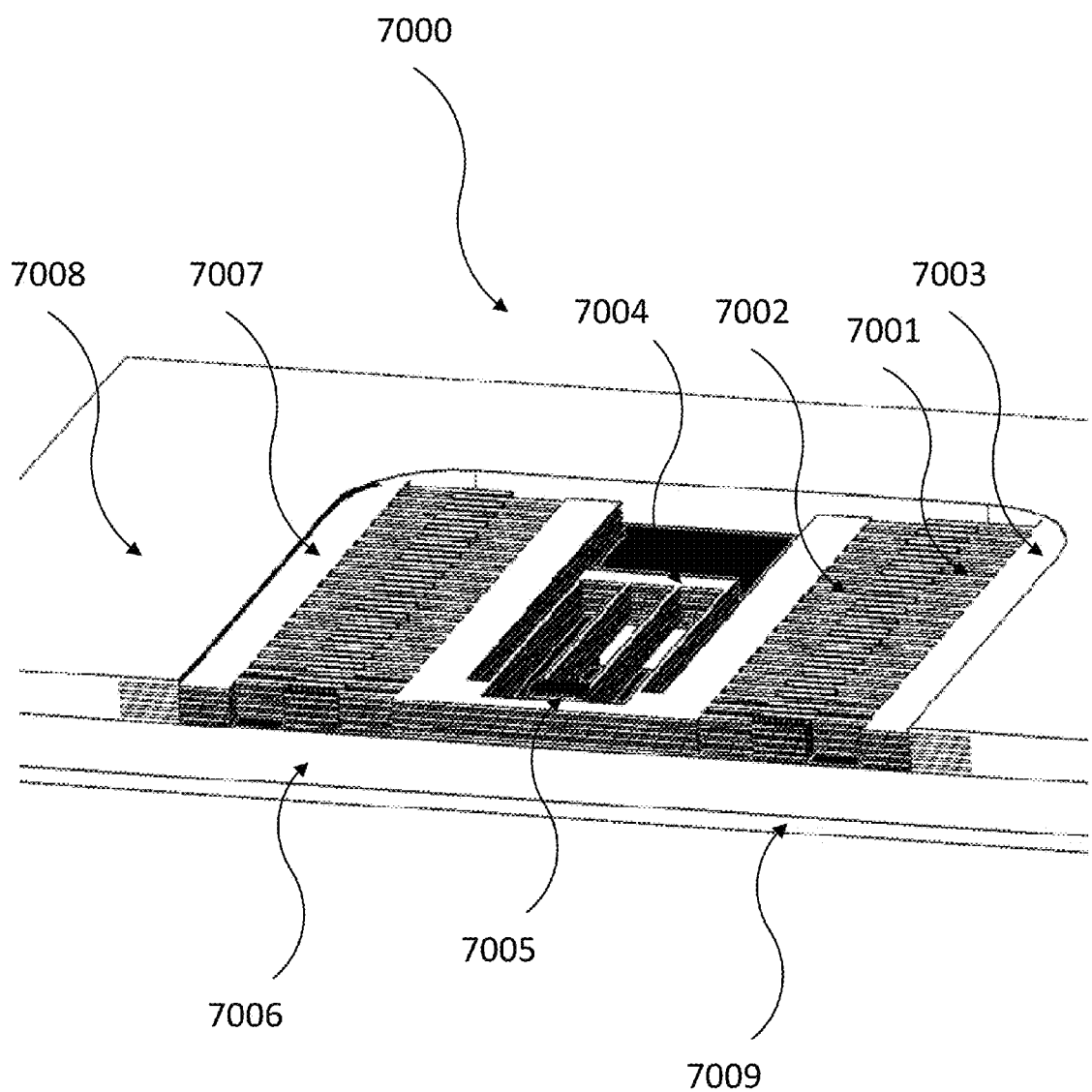
FIG. 20 is an angled view of an exemplar MEMS resonator die fabricated using the inventive structures and methods.
Figure 21:
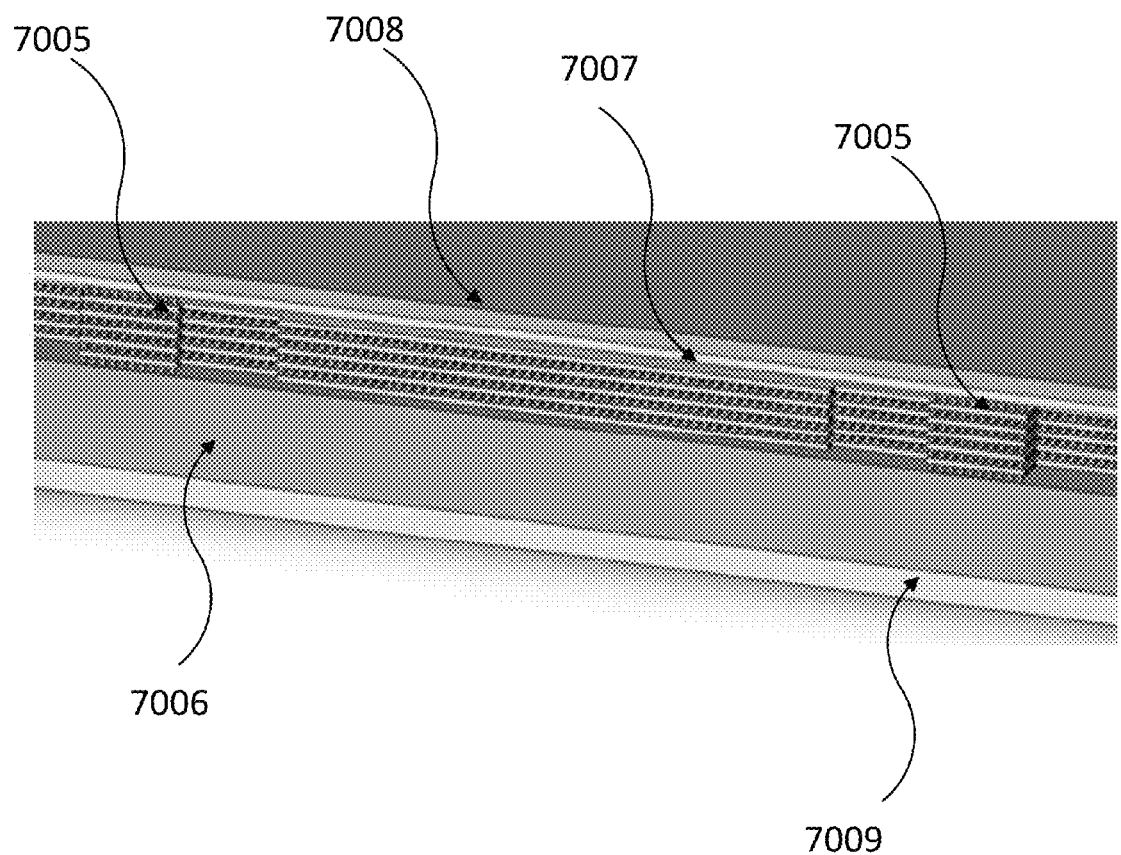
FIG. 21 is a second angled view of an exemplar MEMS resonator die fabricated using the inventive structures and methods.

FIG. 20 and FIG. 21 show an embodiment of a MEMS resonator die 7000 fabricated using some of the inventive methods and structures. Fixed combs 7001 and moving combs 7002 have been built with five metallic layers and a plurality of metal vias between each layer. Fixed combs 7001 extend into the surrounding structure 7003. Moving combs 7002 are attached to springs 7004, which in turn are attached to anchors 7005. Anchors/pillars 7005, incorporated into the fixed portions of the MEMS structure, have been built from metallic layers with a plurality of vias between each layer; anchors/pillars 7005 are fixed in place by connecting them to wafer 7006 on the bottom and metallic layer 7007 on the top; passivation layer 7008 covers the top of the die. Release etch access holes (not shown) in wafer 7006 have been covered with sealing wafer 7009, creating a vacuum in the chamber formed by wafer 7006, metallic layer 7007, and surrounding structure 7003.

In operation, when an alternating current is applied to the resonator, the fingers of moving combs 7002 move between the fingers of fixed combs 7001, the resonant frequency of which determines an impedance minimum between the two elements. Although there is a vacuum in the chamber, anchors/pillars 7005 prevent metallic layer 7007 from bowing and potentially interfering with the movement of moving combs 7002. As such, there is no need for extra space in the chamber to account for bowing, and resonator 7000 will be thinner than prior art resonators. Additionally, metallic layer 7007 will act as a shield to protect the resonator from electromagnetic interference.

Exemplar Application—Fluid Pressure Sensor

Figure 22:
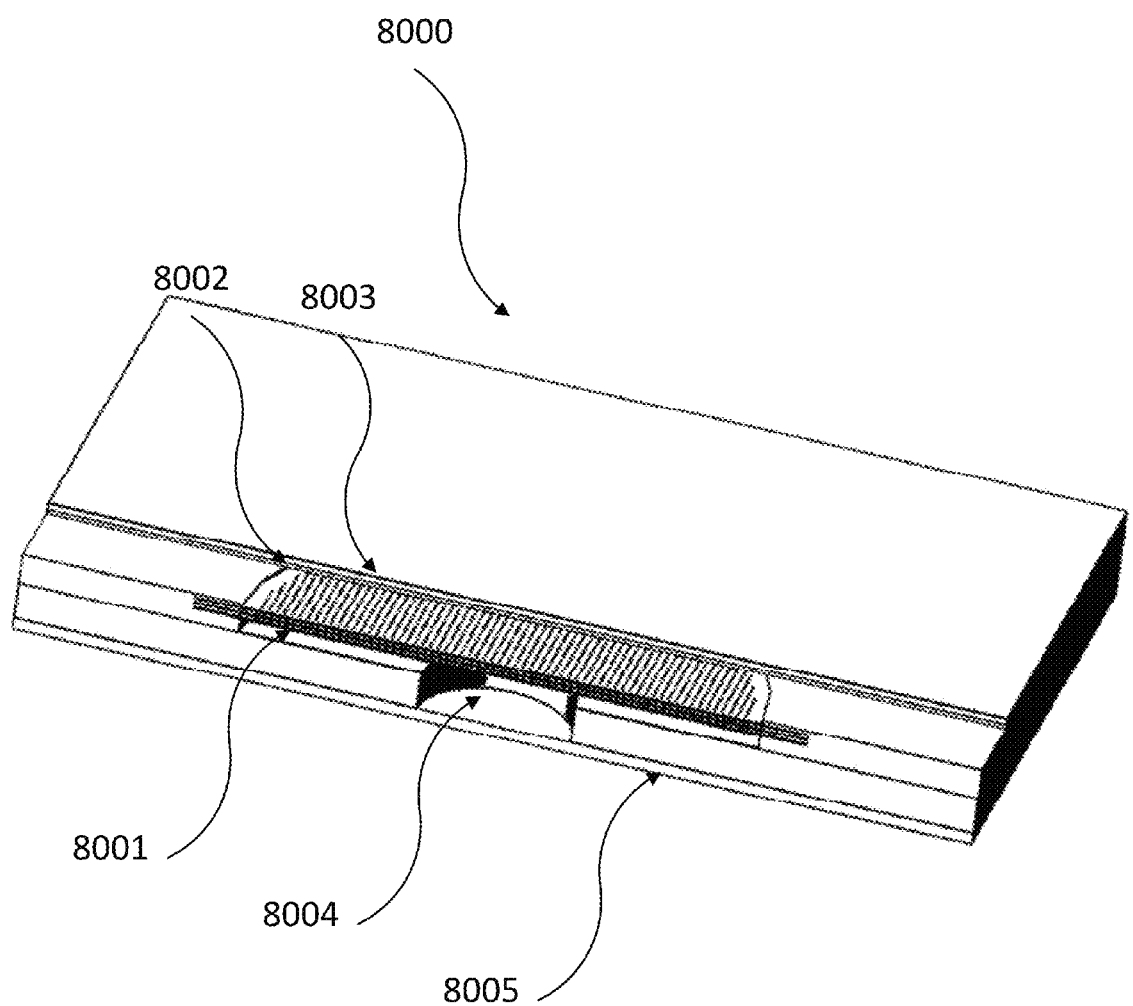
FIG. 22 is an angled view of an exemplar MEMS pressure sensor die fabricated using the inventive structures and methods.
Figure 23:
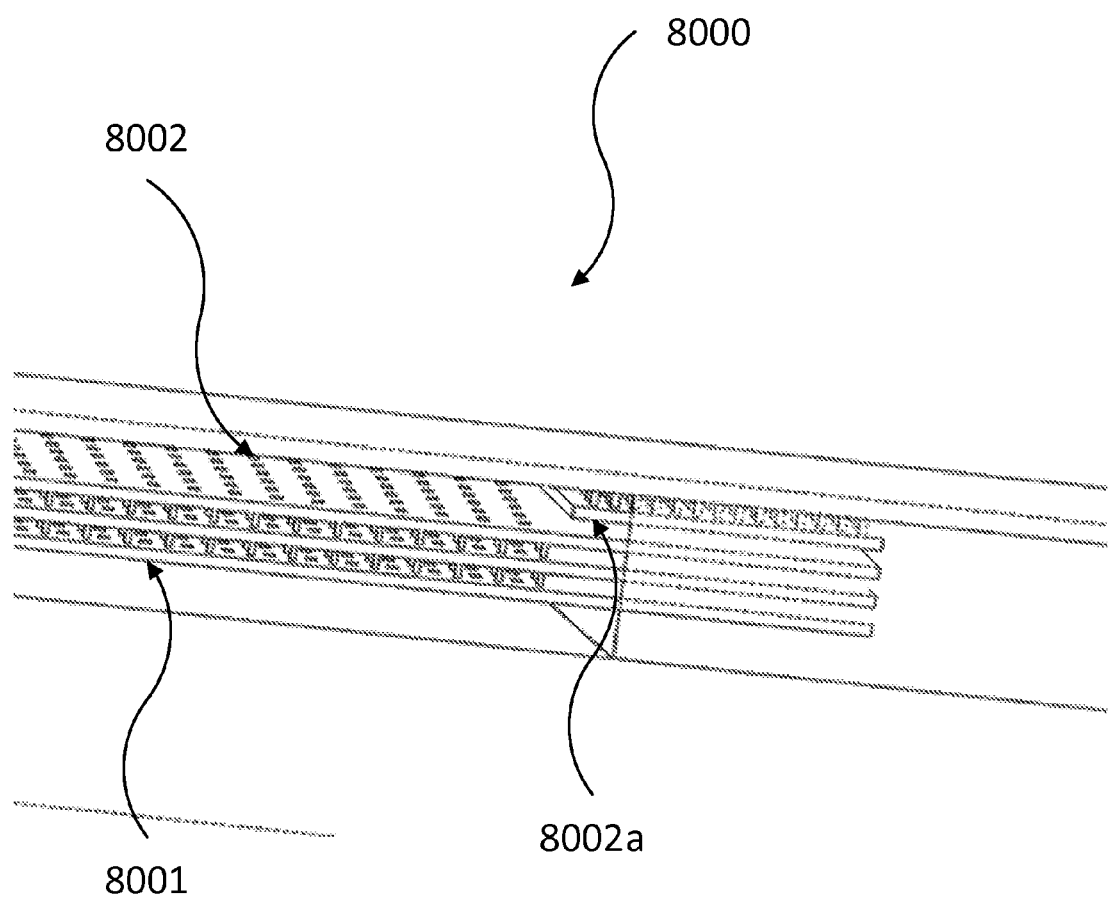
FIG. 23 is a second angled view of an exemplar MEMS pressure sensor die fabricated using the inventive structures and methods.

FIG. 22 and FIG. 23 show an embodiment of a MEMS fluid pressure sensor die 8000. Back plate 8001 has been built from three latticed metallic layers with a plurality of metal vias between each layer. Diaphragm 8002 is built from a top metallic layer above back plate 8001, and a passivation layer 8003 composed of $Si_3N_4$ is formed on top diaphragm 8002.

As can be seen in FIG. 23, an outer portion of diaphragm 8002 includes a second metallic layer 8002*a*. Metallic layer 8002*a* adds firmness to diaphragm 8002, and can be varied in size to change the sensitivity of the sensor. This makes the compliance of the diaphragm less sensitive to the release etch process and its attack on the dielectric of the support structure surrounding the diaphragm.

In operation, as sensor die 8000 is exposed to pressure exerted by fluids or gases, diaphragm 8002 bows in proportion to the amount of pressure, changing the capacitance between diaphragm 8002 and back plate 8001. CMOS circuitry (not shown) in die 8000 detects the change in capacitance and converts it to a usable external signal. Further, as diaphragm 8002 is composed of a metallic layer, it also functions as a low resistance EMI shield to protect the die from electromagnetic interference.

The embodiment of FIG. 22 and FIG. 23 functions an absolute pressure sensor. During the release step, etchant enters through release hole 8004, and after creating release, hole 8004 is covered using sealing wafer 8005, creating a vacuum within the die. As an alternative embodiment, sensor die 8000 could be built without sealing wafer 8005, thus functioning as a differential pressure sensor.

What is claimed is:

1. A diaphragm for a CMOS MEMS capacitive microphone die comprising:
    a first substantially planar metallic layer having a top surface and a bottom surface, where a portion along the perimeter of the first layer defines a first edge of the first layer;
    a second substantially planar metallic layer having a top surface and a bottom surface, where
        a portion along the perimeter of the second layer defines a first edge of the second layer,
        the first edge of the second layer is substantially the same size and shape as the first edge of the first layer, and
        the first edge of the second layer is substantially aligned vertically with the first edge of the first layer, except that the first edge of the first layer extends horizontally, with respect to the geometric horizontal center of the first layer, beyond the first edge of the second layer; and
    a first plurality of vias between the first and second layers, the vias attached to the top surface of the first layer and the bottom surface of the second layer.

2. The diaphragm of claim 1, where:
    a portion along the perimeter of the first layer defines a second edge of the first layer, the second edge of the first layer being a different portion than the first edge of the first layer;
    a portion along the perimeter of the second layer defines a second edge of the second layer, the second edge of the second layer being a different portion than the first edge of the second layer;
    the second edge of the second layer is substantially the same size and shape as the second edge of the first layer; and
    the second edge of the second layer is substantially vertically aligned with the second edge of the first layer, except that the second edge of the second layer extends horizontally, with respect to the geometric horizontal center of the first layer, beyond the second edge of the first layer.

3. The diaphragm of claim 1, further comprising:
    a second plurality of vias extending upwards from the first layer along its first edge where the first edge of the first layer extends beyond the first edge of the second layer.

4. The diaphragm of claim 1, further comprising:
    a third plurality of vias extending downwards from the second layer along its second edge where the second edge of the second layer extends beyond the second edge of the first layer.

5. The diaphragm of claim 1, where:
    the first layer being substantially solid from side to side; and
    the second layer having a plurality of openings between the top surface and bottom surface.

\* \* \* \* \*